(12) United States Patent
Arai

(10) Patent No.: US 11,456,233 B2
(45) Date of Patent: Sep. 27, 2022

(54) SEMICONDUCTOR MODULE, VEHICLE AND MANUFACTURING METHOD

(71) Applicant: FUJI ELECTRIC CO., LTD., Kanagawa (JP)

(72) Inventor: Nobuhide Arai, Matsumoto (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 361 days.

(21) Appl. No.: 16/735,699

(22) Filed: Jan. 7, 2020

(65) Prior Publication Data
US 2020/0266126 A1 Aug. 20, 2020

(30) Foreign Application Priority Data

Feb. 15, 2019 (JP) .............................. JP2019-025043

(51) Int. Cl.
H01L 23/473 (2006.01)
H05K 7/20 (2006.01)
H05K 1/18 (2006.01)
H01L 21/48 (2006.01)
H01L 25/065 (2006.01)
H01L 25/07 (2006.01)

(52) U.S. Cl.
CPC ........ *H01L 23/473* (2013.01); *H01L 21/4878* (2013.01); *H01L 25/0655* (2013.01); *H01L 25/072* (2013.01); *H05K 1/181* (2013.01); *H05K 7/20854* (2013.01); *H05K 7/20872* (2013.01); *H05K 2201/10378* (2013.01)

(58) Field of Classification Search
CPC ............... H01L 23/473; H01L 21/4878; H01L 25/0655; H01L 25/072; H05K 1/181; H05K 7/20854; H05K 7/20872; H05K 2201/10378
See application file for complete search history.

(56) References Cited

U.S. PATENT DOCUMENTS

| 5,514,906 | A | 5/1996 | Love |
| 9,159,645 | B2 * | 10/2015 | Mori ..................... H01L 23/473 |
| 10,014,236 | B2 | 7/2018 | Adachi |

(Continued)

FOREIGN PATENT DOCUMENTS

| CN | 207652885 U | * | 7/2018 |
| JP | H07176654 A | | 7/1995 |

(Continued)

*Primary Examiner* — David Vu
*Assistant Examiner* — Brandon C Fox

(57) ABSTRACT

A semiconductor module comprising a semiconductor apparatus and a cooling apparatus, where: the semiconductor apparatus includes a semiconductor chip and a circuit board on which the semiconductor chip is mounted; and the cooling apparatus includes: a top plate on which the semiconductor apparatus is mounted; a jacket including a side wall connected to the top plate, a bottom plate connected to the side wall and facing the top plate, and a cooling pin fin extending in such a manner as to taper from the bottom plate toward the top plate, where at least the bottom plate and the cooling pin fin are integrally formed, and at least one of ends of the cooling pin fin is firmly fixed to the top plate; and a coolant flow portion defined by the top plate and the jacket and for flow of coolant.

17 Claims, 10 Drawing Sheets

(56) References Cited

U.S. PATENT DOCUMENTS

| | | | | |
|---|---|---|---|---|
| 2009/0065178 A1* | 3/2009 | Kasezawa | ............. | H01L 23/473 |
| | | | | 165/104.19 |
| 2013/0206371 A1* | 8/2013 | Fujita | ........................ | F28F 3/12 |
| | | | | 165/104.28 |
| 2016/0309619 A1* | 10/2016 | Tsai | ........................ | B23P 15/26 |
| 2017/0287809 A1* | 10/2017 | Schultz | ................. | H01L 23/473 |
| 2019/0224740 A1* | 7/2019 | Igarashi | .................... | B21J 5/022 |
| 2019/0373772 A1* | 12/2019 | Mayberry | ............... | F28F 13/14 |
| 2019/0385925 A1* | 12/2019 | Walczyk | ............... | H01L 23/367 |

FOREIGN PATENT DOCUMENTS

| | | |
|---|---|---|
| JP | H10321774 A | 12/1998 |
| JP | 2009277768 A | 11/2009 |
| JP | 2017183421 A | 10/2017 |
| WO | 2014069174 A1 | 5/2014 |

* cited by examiner

[TIP SIDE]
94
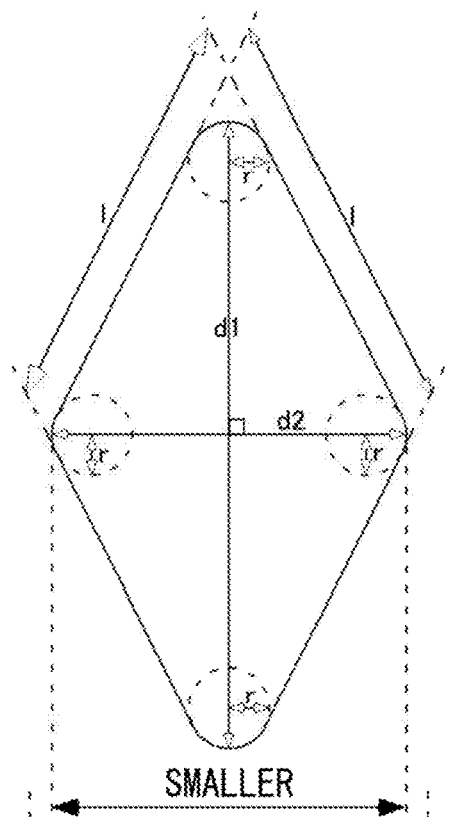
[BASE SIDE]
94
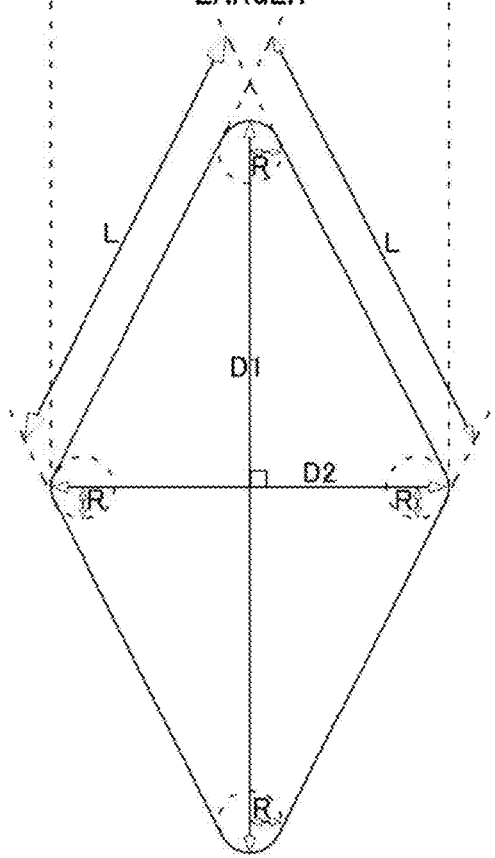
FIG. 6
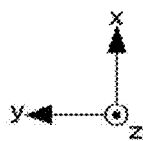

SEMICONDUCTOR MODULE, VEHICLE AND MANUFACTURING METHOD

The contents of the following Japanese patent application are incorporated herein by reference:
NO. 2019-025043 filed on Feb. 15, 2019

BACKGROUND

1. Technical Field

The present invention relates to a semiconductor module, a vehicle and a manufacturing method.

2. Related Art

In the prior art, there are known semiconductor modules which include a plurality of semiconductor devices such as power semiconductor chips, and are equipped with a cooling apparatus including cooling fins (see Patent documents 1-5 for example).

PRIOR ART DOCUMENTS

Patent Documents

Patent document 1: Japanese Patent Application Publication No. 2017-183421
Patent document 2: WO 2014/069174
Patent document 3: Japanese Patent Application Publication No. 2009-277768
Patent document 4: Japanese Patent Application Publication No. 7-176654
Patent document 5: Japanese Patent Application Publication No. 10-321774

SUMMARY

For the above-mentioned semiconductor module, when flow rate of coolant flowing inside the cooling apparatus is low, an efficiency of transferring heat generated by the plurality of semiconductor devices to the coolant passing close to cooling fins is low.

To solve the above-mentioned problem, according to a first aspect of the present invention, provided is a semiconductor module including a semiconductor apparatus and a cooling apparatus. The semiconductor apparatus may have a semiconductor chip and a circuit board on which the semiconductor chip is mounted. The cooling apparatus may include a top plate on which the semiconductor apparatus is mounted. The cooling apparatus may include a jacket including a side wall connected to the top plate, a bottom plate connected to the side wall and facing the top plate, and a cooling pin fin extending in such a manner as to taper from the bottom plate toward the top plate. At least the bottom plate and the cooling pin fin may be integrally formed in the jacket. At least one of ends of the cooling pin fin in the jacket may be firmly fixed to the top plate. The cooling apparatus may include a coolant flow portion defined by the top plate and the jacket, and for flow of coolant.

The cooling apparatus may include an inlet in communication with one of sections of the coolant flow portion, the one section being associated with one direction, and for letting coolant into the coolant flow portion. The cooling apparatus may include an outlet in communication with another section of the coolant flow portion, the other section being associated with another direction opposite to the one direction, and for letting coolant out of the coolant flow portion. The cooling pin fin may have a substantially rhombic shape long in a direction from the one section toward the other section and having round corners when viewed in cross section in a plane parallel to a principal surface of the top plate.

A curvature radius of the corners in the cross section of the cooling pin fin may be greater at a position close to the top plate than at a position close to the bottom plate.

The coolant flow portion may have a substantially rectangular shape having longer sides and shorter sides in the plane. The coolant flow portion may have a fin region including the cooling pin fin and having a substantially rectangular shape longer along the longer sides than along the shorter sides. The coolant flow portion may have one communication region located at a greater position in the one direction than the fin region, being in communication with the inlet and extending along the longer sides. The coolant flow portion may have another communication region located at a greater position in the other direction than the fin region, being in communication with the outlet and extending along the longer sides.

The side wall may extend in such a manner as to taper from the bottom plate toward the top plate.

A thickness of the side wall may be greater than a thickness of the top plate, and a thickness of the bottom plate may be greater than the thickness of the side wall.

The side wall and the cooling pin fin may be the same in dimension.

The cooling pin fin and the top plate may be firmly fixed with a fixing agent. A distance between cooling pin fins adjacent to each other among the plurality of cooling pin fins may be greater than or equal to 5 times a thickness of the fixing agent.

Corners of the cooling pin fin that are firmly fixed to the top plate may be chamfered, so that the fixing agent has a region in which a fillet has been formed.

According to a second aspect of the present invention, provided is a vehicle including the semiconductor module according to the first aspect.

According to a third aspect of the present invention, provided is a method for manufacturing the semiconductor module according to the first aspect. In the manufacturing method, the jacket may be formed by punching a single continuous plate member using a mold corresponding to a shape of the jacket.

The summary clause does not necessarily describe all necessary features of the embodiments of the present invention. The present invention may also be a sub-combination of the features described above.

BRIEF DESCRIPTION OF THE DRAWINGS

FIG. 6 illustrates one example of a shape of the cross section of the cooling pin fin 94 cut along an x-y plane.

DESCRIPTION OF EXEMPLARY EMBODIMENTS

Hereinafter, the present invention will be described with reference to embodiments of the invention. However, the following embodiments should not to be construed as limiting the claimed invention. Also, all the combinations of the features described in the embodiments are not necessarily essential for means provided by aspects of the invention.

Figure 1:
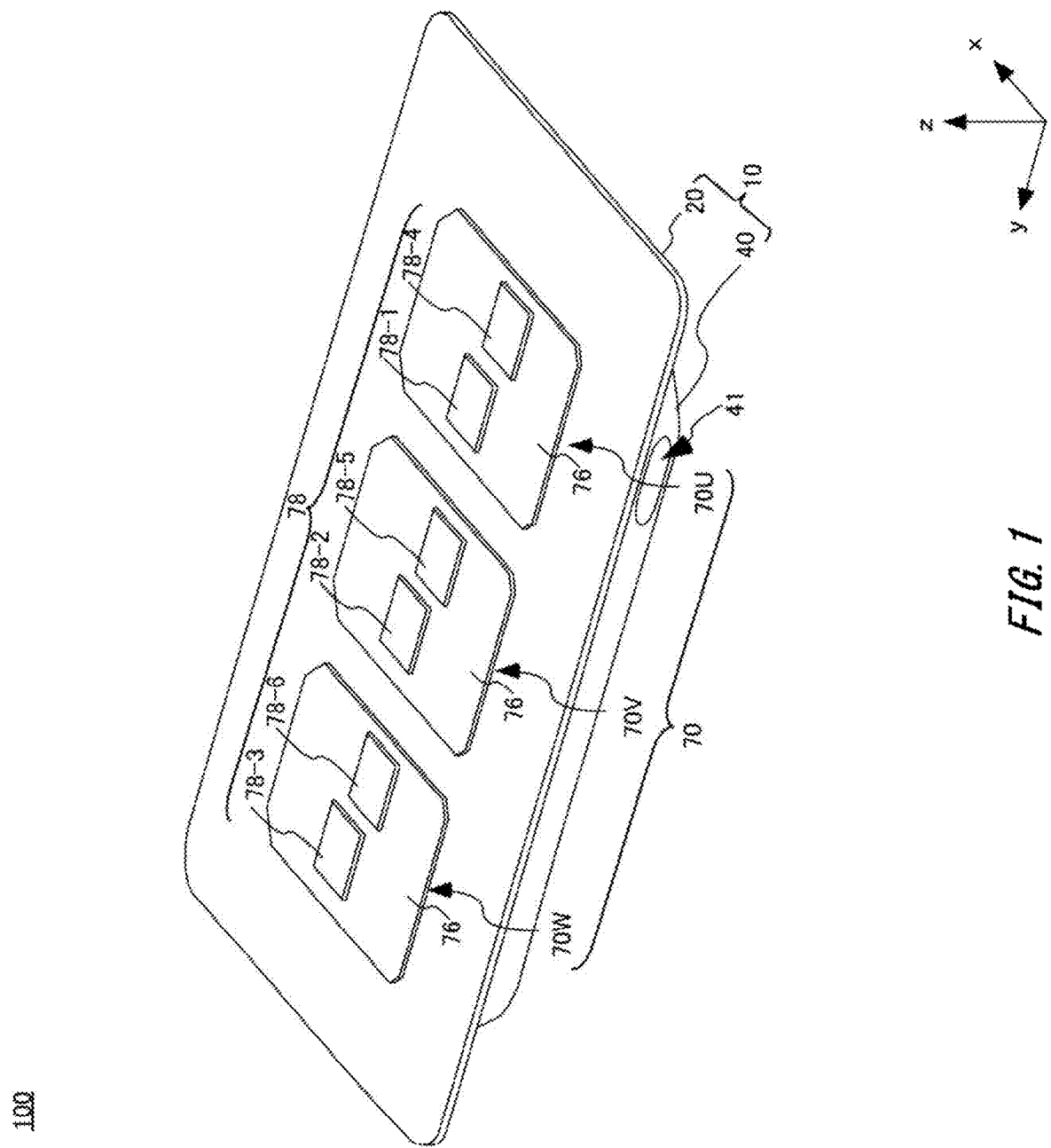
FIG. 1 is a schematic perspective view showing one example of a semiconductor module 100 according to one embodiment of the present invention.
Figure 2:
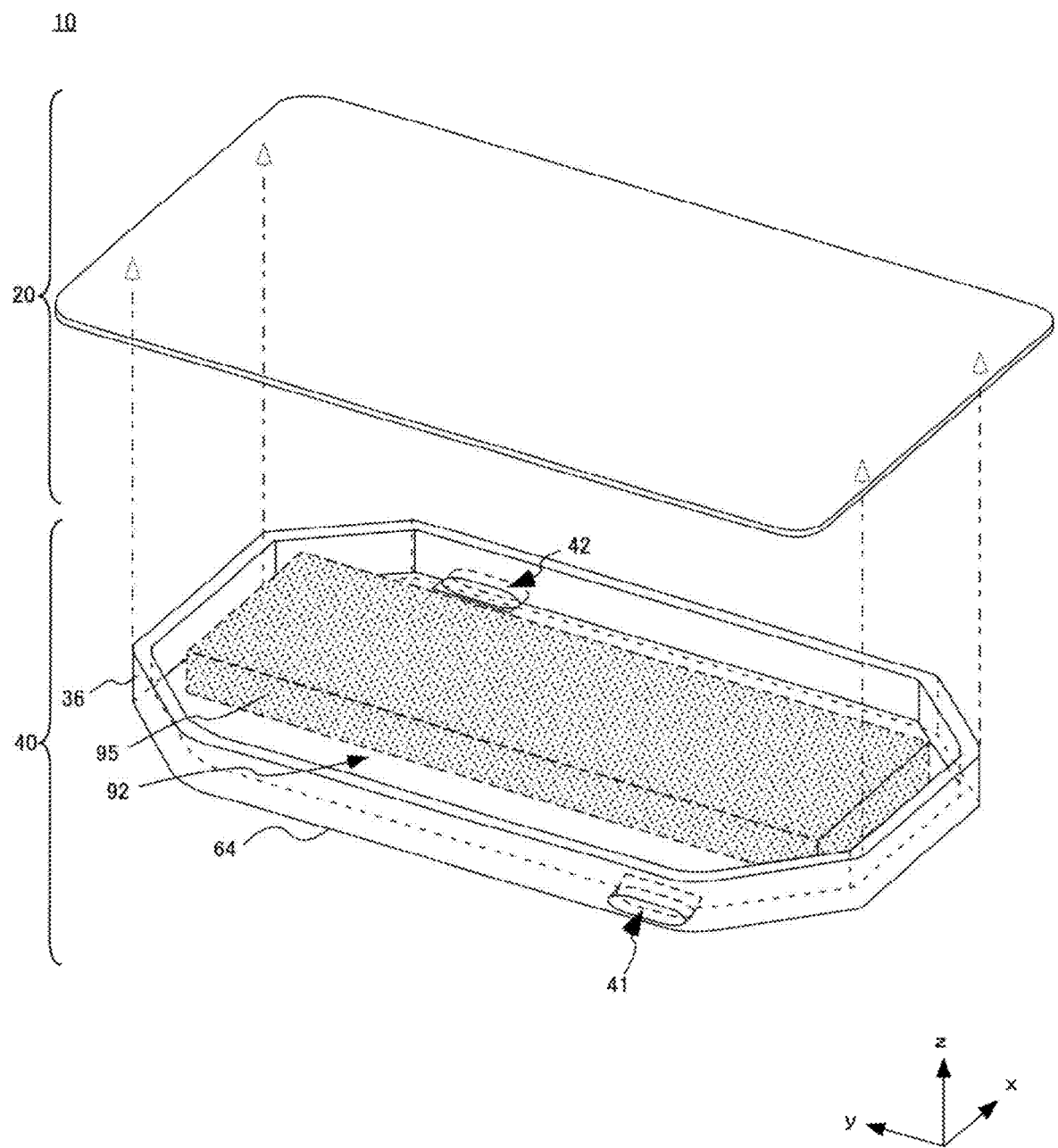
FIG. 2 is a schematic perspective view showing one example of a cooling apparatus 10 of the semiconductor module 100 according to one embodiment of the present invention.
Figure 3:
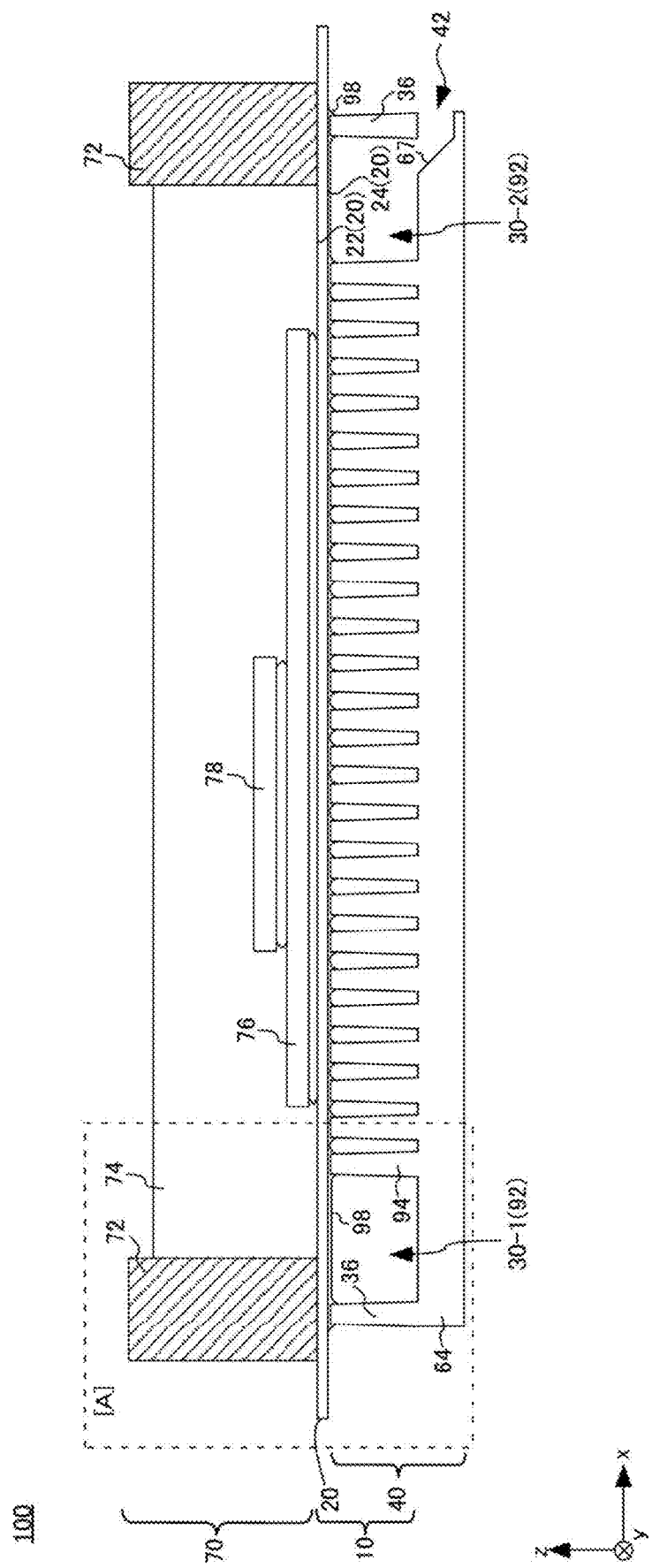
FIG. 3 is a schematic cross-sectional view showing one example of the semiconductor module 100 according to one embodiment of the present invention.
Figure 4:
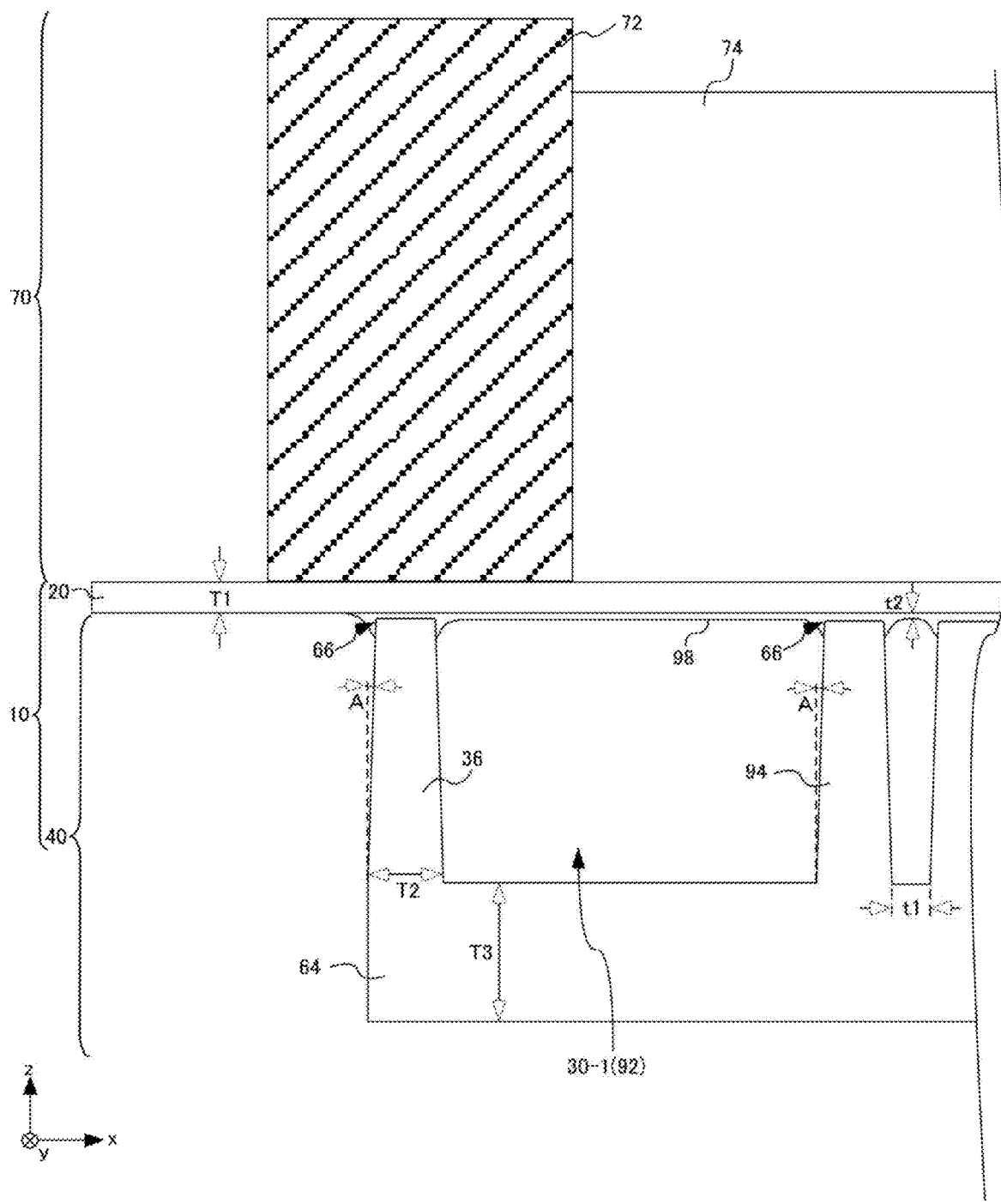
FIG. 4 is an enlarged partial view of a region A shown with a dashed line in FIG. 3.
Figure 5:
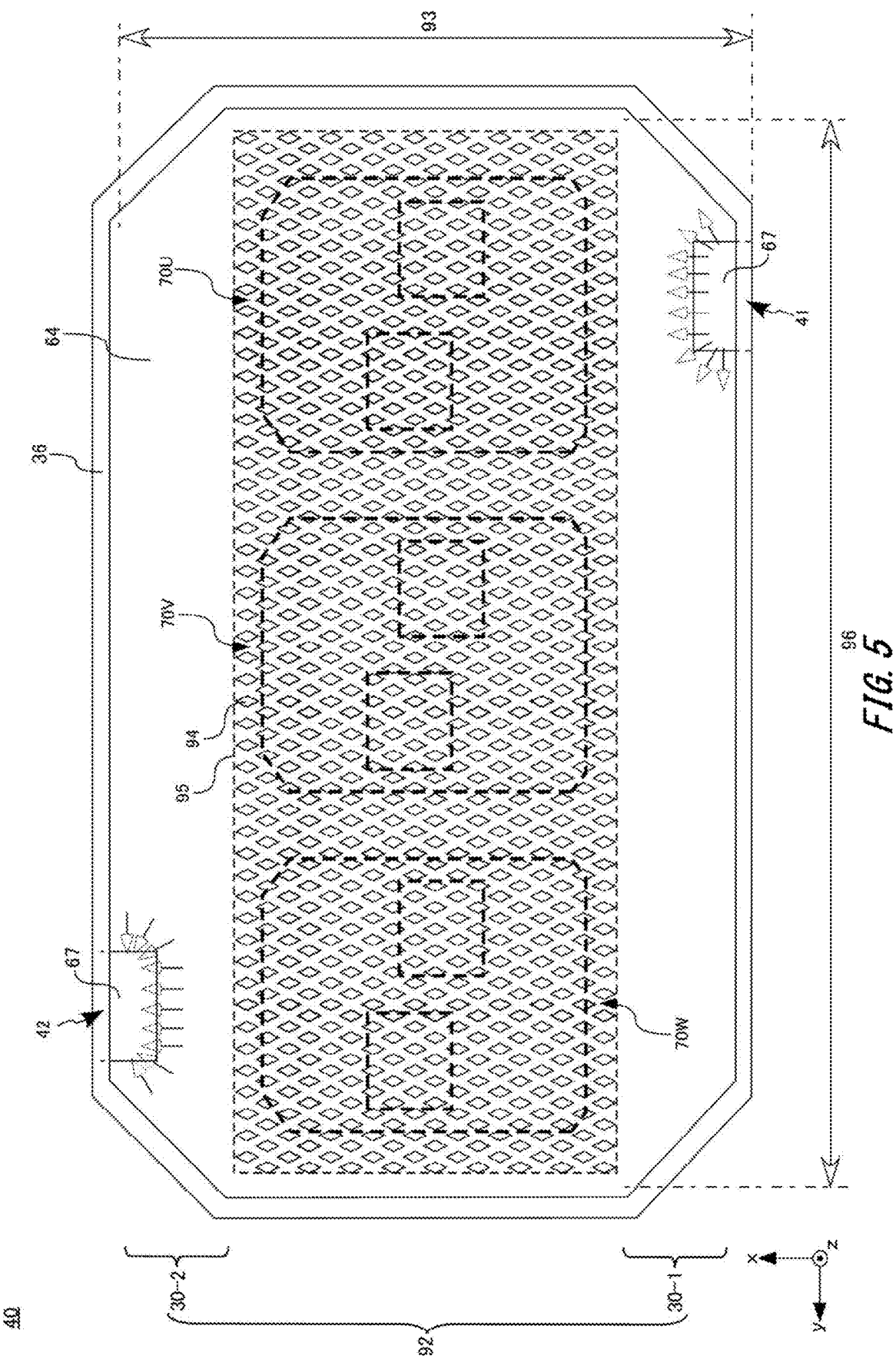
FIG. 5 shows one example of an arrangement of a fin region 95 and a semiconductor apparatus 70, a shape of a cooling pin fin 94 and a flow direction of coolant, in the cooling apparatus 10 of the semiconductor module 100 according to one embodiment of the present invention.

FIG. 1 is a schematic perspective view showing one example of a semiconductor module 100 according to one embodiment of the present invention, and FIG. 2 is a schematic perspective view showing one example of a cooling apparatus 10 of the semiconductor module 100. Also, FIG. 3 is a schematic cross-sectional view showing one example of the semiconductor module 100 according to one embodiment of the present invention, and FIG. 4 is an enlarged partial view of a region A shown with a dashed line in FIG. 3. Further, FIG. 5 shows one example of an arrangement of a fin region 95 and a semiconductor apparatus 70, a shape of a cooling pin fin 94 and a flow direction of coolant, in the cooling apparatus 10 of the semiconductor module 100 according to one embodiment of the present invention.

Note that for simplicity, in FIG. 2, the fin region 95 is indicated with dots instead, which is a region provided with the cooling pin fins 94, which are omitted in the figure. Further, FIG. 3 shows the semiconductor chip 78 of the U-phase unit 70U in the semiconductor module 100 shown in FIG. 1 and an outlet 42 of the cooling apparatus 10 shown in FIG. 2 in cross sections given by imaginarily cutting through them along an x-z plane. Yet further, a U-phase unit 70U, a V-phase unit 70V and a W-phase unit 70W shown in FIG. 1 are indicated with dashed lines in FIG. 5.

The semiconductor module 100 includes the semiconductor apparatus 70 and the cooling apparatus 10. The semiconductor apparatus 70 in this example is placed on the cooling apparatus 10. In this specification, a plane parallel to the plane of the cooling apparatus 10 on which the semiconductor apparatus 70 is placed is referred to as an x-y plane, and an axis perpendicular to the x-y plane is referred to as a z axis. The x, y and z axes form a right-handed system. In this specification, although the direction from the cooling apparatus 10 toward the semiconductor apparatus 70 in the z-direction is referred to as an upper direction and the direction opposite to the upper direction as a lower direction, the upper and lower directions are not limited to the gravitational direction. Also, in this specification, a surface of surfaces of each member on the upper side is referred to as an upper surface, a surface on the lower side is referred to as a lower surface, and a surface between the upper and lower surfaces is referred to as a side surface. In this specification, a planar view means a view of the semiconductor module 100 as seen from a positive z-direction.

The semiconductor apparatus 70 includes the semiconductor chip 78 and a circuit board 76 on which the semiconductor chip 78 is mounted. The semiconductor apparatus 70 in this example may have three circuit boards 76, and each of the circuit boards 76 may have two semiconductor chips 78 mounted thereon. The semiconductor apparatus 70 in this example is a power semiconductor apparatus, and may include the U-phase unit 70U having the circuit board 76 and semiconductor chips 78-1 and 78-4, the V-phase unit 70V having the circuit board 76 and semiconductor chips 78-2 and 78-5, and the W-phase unit 70W having the circuit board 76 and semiconductor chips 78-3 and 78-6. The semiconductor module 100 in this example may serve as an apparatus which constitutes a three-phase AC inverter. Each semiconductor chip 78 of the U-phase unit 70U, the V-phase unit 70V and the W-phase unit 70W is a heat source which generates heat when the semiconductor module 100 is in operation.

The semiconductor chip 78 in this example is a vertical semiconductor device, and may have an upper-surface electrode and a lower-surface electrode. The semiconductor chip 78 may include a device such as, for example, an Insulated Gate Bipolar Transistor (IGBT), an MOS Field-Effect Transistor (MOSFET) and a Free Wheeling Diode (FWD) that are formed on a semiconductor substrate of silicon or the like. The semiconductor chip 78 may be a Reverse Conducting IGBT (RC-IGBT) in which the IGBT and the FWD are integrated on a single semiconductor substrate. In the RC-IGBT, the IGBT and the FWD may be in an inverse-parallel connection.

The lower-surface electrode of the semiconductor chip 78 may be connected to an upper surface of the circuit board 76. The upper-surface electrode of the semiconductor chip 78 may be an emitter, source or anode electrode, and the lower-surface electrode may be a collector, drain or cathode electrode. The semiconductor substrate of the semiconductor chip 78 may be made of silicon carbide (SiC) or gallium nitride (GaN).

The semiconductor chip 78 with a switching device such as the IGBT or the MOSFET may have a control electrode. The semiconductor module 100 may include a control terminal connected to the control electrode of the semiconductor chip 78. The switching device can be controlled by an external control circuit via the control terminal.

The circuit board 76 may be, for example, a laminated substrate which successively includes an insulating plate having upper and lower surfaces, and a circuit layer and a metal layer provided respectively on the upper and lower surfaces of the insulating plate. The circuit board 76 has upper and lower surfaces, and the lower surface may be arranged on an upper surface of the cooling apparatus 10. As one example, the circuit board 76 may be fixed on the upper surface of the cooling apparatus 10 by soldering or the like via the metal layer. Further, as one example, two semiconductor chips 78 may be fixed on the upper-surface side of the circuit board 76 via the circuit layer.

The circuit board 76 may be a DCB (Direct Copper Bonding) substrate or an AMB (Active Metal Brazing) substrate, for example. The insulating plate may be formed of a ceramic material such as alumina ($Al_2O_3$), aluminum nitride (AlN) and silicon nitride ($Si_3N_4$). The circuit layer and the metal layer may be a plate containing a conductive material such as copper or an alloy of copper. The circuit layer may be fixed on the upper-surface side of the insulating plate by soldering, brazing or the like. The semiconductor chip 78 may be electrically and mechanically connected by soldering or the like, that is, directly connected in a circuitry manner, to an upper surface of the circuit layer. The circuit layer may be electrically connected to other conductive members with wires or the like.

The semiconductor apparatus 70 may additionally have an accommodating portion 72, as shown in FIGS. 3 and 4. The accommodating portion 72 is a frame formed of an insulating material such as, for example, a thermally curable resin and a ultraviolet curable resin, and may be provided to surround a region in which the circuit board 76 and others are arranged on the upper surface of the cooling apparatus 10. The accommodating portion 72 may be bonded to the upper surface of the cooling apparatus 10. The accommodating portion 72 has an inner space, which will accommodate the semiconductor chip 78, the circuit board 76 and other circuit elements. The accommodating portion 72 may accommodate respective components of the semiconductor apparatus 70 including the circuit board 76 and the semiconductor chip 78, in the inner space. An insulating material used for forming the accommodating portion 72 may be selected from resins such as poly(phenylene sulfide) (PPS), poly(butylene terephthalate) (PBT), poly(butyl acrylate) (PBA), polyamide (PA), acrylonitrile butadiene styrene (ABS), liquid crystal polymer (LCP), polyether ether ketone (PEEK), poly(butylene succinate) (PBS), urethane or silicone.

The inner space of the accommodating portion 72 may be filled with a sealing portion 74 for sealing the semiconductor chip 78, the circuit board 76 and the other circuit elements. The accommodating portion 72 may define, in the planar view, a region to be filled with the sealing portion 74. The sealing portion 74 may be an insulating member including a resin such as, for example, a silicone gel or an epoxy resin. For simplicity of description, illustration of the accommodating portion 72 and the sealing portion 74 is omitted in FIG. 1.

The cooling apparatus 10 has a top plate 20 on which the semiconductor apparatus 70 is mounted, and a jacket 40. The cooling apparatus 10 also has a coolant flow portion 92 for flow of coolant that is defined by the top plate 20 and the jacket 40.

The top plate 20 in this example may be a plate-like member having a principal surface spreading in the x-y plane. The top plate 20 in this example may have a substantially rectangular shape with longer sides and shorter sides in the planar view. The shorter and longer sides of the top plate 20 in this example may be parallel to the x axis and the y axis, respectively.

As shown in FIG. 3, the top plate 20 in this example may have an upper surface (front surface) 22 and a lower surface (back surface) 24 that are parallel to the x-y plane. As one example, the top plate 20 is formed of metal. As a more specific example, it may be formed of metal including aluminum. A plating layer of nickel or the like may be formed on a surface of the top plate 20. The semiconductor apparatus 70 is placed on the upper surface 22 of the top plate 20. In this case, the circuit board 76 of the semiconductor apparatus 70 may be directly fixed on the upper surface 22 of the top plate 20 by soldering or the like. Heat generated in the respective semiconductor chips 78 is transferred to the top plate 20. The top plate 20, the circuit board 76 and the semiconductor chip 78 are arranged in this order in the positive z-direction. The top plate 20 and the circuit board 76 may be thermally connected together, and so too with the circuit board 76 and the semiconductor chip 78. When the respective members are soldered together, they are thermally connected via the solder.

The jacket 40 includes a side wall 36 to be connected to the top plate 20, and a bottom plate 64 connected to the side wall 36 and facing the top plate 20. The jacket 40 also includes cooling pin fins 94 extending from the bottom plate 64 toward the top plate 20.

The side wall 36 in this example may extend in such a manner as to taper from the bottom plate 64 toward the top plate 20 in the positive z-direction to constitute a side surface of the cooling apparatus 10. The side wall 36 may be tapered when viewed in cross section in a plane perpendicular to the bottom plate 64. One of ends of the side wall 36 in this example that is close to the top plate 20 may be firmly fixed to the top plate 20 with a fixing agent 98. Further, as shown in FIG. 4, a side surface of the side wall 36 may have a linear profile, and may have at an angle of A relative to the z axis, when viewed in cross section in the x-z plane. The angle A may range, for example, from 1 degree to 2 degrees. Alternatively, the side surface of the side wall 36 may have a smoothly curved profile or may have a stepped profile, when viewed in cross section in the x-z plane.

In FIG. 4, a thickness of the top plate 20 in the z-direction is indicated as T1, and a thickness of an x-y plane cross section of the side wall 36 is indicated as T2. As seen from the figure, the thickness T2 of the side wall 36 may be greater than the thickness T1 of the top plate 20. The thickness T2 may be a thickness of a base portion of the side wall 36. The lesser thickness T1 of the top plate 20 allows heat generated by each semiconductor chip 78 of the semiconductor apparatus 70 to be efficiently transferred to the coolant inside the coolant flow portion 92, while the greater thickness T2 of the side wall 36 allows the strength of the top plate 20, which may decrease due to the small thickness T1 of the top plate 20, to be reinforced to prevent deformation such as distortion from occurring in the top plate 20 under mechanical or thermal influence.

The side wall 36 in this example may have a substantially rectangular profile having longer sides and shorter sides in the x-y plane. In this example, the side wall 36 constitutes the side surface of the cooling apparatus 10, and the shorter and longer sides of the profile of the side wall 36 may therefore be parallel to the x axis and the y axis in the planar view, respectively.

The bottom plate 64 in this example may be a plate-like member, and may constitute a bottom surface of the cooling apparatus 10. Further, the bottom plate 64 in this example may have a substantially rectangular shape having longer sides and shorter sides in the x-y plane. The bottom plate 64 in this example may have a polygon shape such as an octagon in the x-y plane. In this example, the bottom plate 64 constitutes the bottom surface of the cooling apparatus 10, and the shorter and longer sides of the bottom plate 64 may therefore be parallel to the x axis and y axis in the planar view, respectively.

The bottom plate 64 is formed integrally with the cooling pin fins 94. The bottom plate 64 in this example may be formed integrally with the side wall 36 and the cooling pin fins 94. In this case, the jacket 40 including the side wall 36, the bottom plate 64 and the cooling pin fins 94 may be integrally formed out of a single continuous plate member. For example, the jacket 40 may be formed by punching the single continuous plate member using a mold corresponding to the shape of the jacket 40. In another example, the jacket 40 may be formed by performing molding using any forging method such as cold forging under an ordinary temperature environment which uses impact pressing or the like, or warm forging, hot forging and liquid metal forging under a high temperature environment, or performing casting or metal injection molding (MIM).

The bottom plate 64 in this example may have formed therein and in the vicinity of the boundary with the side wall 36, an inlet 41 which is a penetration hole for letting coolant into the coolant flow portion 92 and an outlet 42 which is a penetration hole for letting the coolant out of the coolant flow portion 92. In addition, the bottom plate 64 in this example may have formed therein inclined portions 67 respectively connected to the inlet 41 and the outlet 42 and inclined to the z-direction.

Pipes in communication with an external coolant supply source may be respectively connected to the inlet 41 and the outlet 42. In other words, the cooling apparatus 10 may be connected to the external coolant supply source with the two pipes. As such, the cooling apparatus 10 may be supplied with coolant from one of the pipes through the inlet 41, and the coolant may circulate inside the coolant flow portion 92 and then be drained to the other pipe through the outlet 42.

The inlet 41 and the outlet 42 in this example may be located in sections of the cooling apparatus 10 that are associated with one direction and another direction opposite to the one direction along the x axis, respectively, and be located in sections of the cooling apparatus 10 that are associated with one direction and another direction opposite to the one direction along the y axis, respectively. In other words, the inlet 41 and the outlet 42 may be located at diagonally opposite ends of the coolant flow portion 92, which has a substantially rectangular shape in the x-y plane. In this manner, the inlet 41 may be in communication with one of sections of the coolant flow portion 92 and the outlet 42 may be in communication with another section opposite to the one section of the coolant flow portion 92.

Furthermore, a thickness of the bottom plate 64 in the z-direction is indicated as T3 in FIG. 4, and as seen from the figure, the thickness T3 of the bottom plate 64 may be greater than the thickness T2 of the above-mentioned side wall 36. This can ensure the strength of the bottom plate 64 which is the base of the integrally formed jacket 40 and prevent the jacket 40 from being deformed, when, for example, the jacket 40 is forged, etc. out of a single plate member as described above. Further, for example, when the penetration holes, the inlet 41 and the outlet 42, are formed through the bottom plate 64 as described above, by forming the inlet 41 and the outlet 42 through the bottom plate 64 which has a greater thickness than the top plate 20 and the side wall 36 after forming the jacket 40 including the side wall 36, the bottom plate 64 and the cooling pin fins 94, the strength of the cooling apparatus 10 can be enhanced and the processing of the cooling apparatus 10 can be facilitated.

Each of the cooling pin fins 94 is arranged in the coolant flow portion 92, has upper and lower ends mutually opposed in the z-direction and extends in such a manner as to taper from the bottom plate 64 toward the top plate 20 in the positive z-direction, as shown in FIG. 4 which is the enlarged partial view of region A of FIG. 3. The cooling pin fin 94 may be tapered when viewed in cross section in any plane perpendicular to the bottom plate 64. One of ends of the cooling pin fin 94 that is close to the top plate 20 is firmly fixed to the top plate 20 with the fixing agent 98. The upper end of the cooling pin fin 94 may be thermally and mechanically connected to the lower surface 24 of the top plate 20, and extend from the lower surface 24 of the top plate 20 toward the coolant flow portion 92. In addition, the cooling pin fin 94 in this example may extend substantially orthogonally to the respective principal surfaces of the top plate 20 and the bottom plate 64 and in the z-direction, as shown in FIGS. 3 and 4.

As shown in FIG. 4, a side surface of the cooling pin fin 94 may have a linear profile, and may have an angle of A ranging, for example, from 1 degree to 2 degrees relative to the z axis, as with the side surface of the side wall 36, when viewed in cross section in the x-z plane. The cooling pin fin 94 and the side wall 36 may be the same in dimension. Alternatively, the side surface of the cooling pin fin 94 may have a smoothly curved profile or may have a stepped profile, when viewed in cross section in the x-z plane.

Corners of the cooling pin fin 94 in this example that are firmly fixed to the top plate 20 may be chamfered as shown in FIG. 4. In the description below, the portions of the cooling pin fin 94 on which chamfering is performed can be referred to as chamfered portions 66. When the top plate 20 and the cooling pin fin 94 are firmly fixed together with the fixing agent 98 such as a brazing material or the like, the brazing material might flows down out of the firmly fixed region. In contrast, by performing chamfering to provide the cooling pin fin 94 with the above-mentioned chamfered portions 66 and firmly fixing the top plate 20 and the cooling pin fin 94 together with the top plate 20 placed above the cooling pin fin 94 in the gravitational direction as shown in the figure until the fixing agent 98 sets, the fixing agent 98 accordingly has a region in which a fillet has been formed, successfully avoiding the flow-down of the brazing material.

The chamfered portions 66 may be C-chamfered or R-chamfered. For the similar purpose, corners of the side wall 36 that are firmly fixed to the top plate 20 may have chamfered portions 66 as shown in FIG. 4.

There may be the plurality of cooling pin fins 94 in the jacket 40 in this example, and as shown in FIG. 5, may be arranged in a predetermined pattern in the x-y plane. A distance between ones of the plurality of cooling pin fins 94 that are the most adjacent of the cooling pin fins adjacent to one another in this example may be greater than or equal to 5 times the thickness of the above-described fixing agent 98 used for firmly fixing the cooling pin fins 94 to the top plate 20. As one example, the thickness of the fixing agent 98 may ranges from 20 to 50 μm, and the distance between ones of the plurality of the cooling pin fins 94 adjacent to one another may ranges from 100 to 250 μm or more. This can prevent the brazing material applied to the lower surface 24 of the top plate 20 from clogging between the adjacent cooling pin fins 94. Alternatively, the distance between ones of the plurality of cooling pin fins 94 that are the most adjacent of the cooling pin fins 94 adjacent to one another in this example may be 1 mm or more. This can prevent a foreign object which has a dimension of approximately 300 to 900 μm and may flow inside the coolant flow portion 92 from clogging between the cooling pin fins 94. Further, the plurality of cooling pin fins 94 in this example may be located inside relative to the side wall 36 and surrounded by the side wall 36 in the planar view.

As shown in FIG. 5, at least one of the plurality of cooling pin fins 94 in this example may have a substantially rhombic shape which is long in a direction from the one section of the coolant flow portion 92 that is associated with the one direction along the x axis and has the above-mentioned inlet 41 formed therein toward the other section of the coolant flow portion 92 that is associated with the opposite direction along the x axis and has the above-mentioned outlet 42 formed therein, and of which the corners are round, when viewed in cross section in the x-y plane parallel to the principal surface of the top plate 20. Further, the diagonal in the y-direction may shorter than the diagonal in the x-direction of the pair of diagonals of the substantially rhombic shape. Note that to provide a large heat dissipation area in the cooling pin fin 94 to enhance its cooling efficiency, the substantially rhombic shape is preferable to a square, rectangular, another polygonal shape, or the like which is possible as a shape of the x-y plane cross section of the cooling pin fin 94. In the description below, one or more cooling pin fins 94 can be referred to just as the cooling pin fins 94.

The coolant flow portion 92 is defined by the top plate 20 and the jacket 40 as described above. In other words, the side wall 36 may be arranged to surround the coolant flow portion 92 in the x-y plane, and the top plate 20 and the bottom plate 64 may be arranged to face each other sandwiching the coolant flow portion 92 therebetween in the z-direction. As such, in this case, a profile of the coolant flow portion 92 in the x-y plane is defined by the inner circumference of the side wall 36, and therefore, the coolant flow portion 92 may have a substantially rectangular shape with longer sides 96 and shorter sides 93 in the x-y plane as shown in FIG. 5. Coolant such as LLC and water flows inside the coolant flow portion 92. The coolant is let in through the inlet 41 in communication with one of sections of the coolant flow portion 92 associated with one direction along the shorter side 93 and let out through the outlet 42 in communication with another section associated with another direction along the shorter side 93. The coolant contacts the lower surface 24 of the top plate 20 on which the circuit board 76 is arranged and the cooling pin fins 94, and cools the semiconductor apparatus 70.

The coolant flow portion 92 may be a sealed space contacting each of the top plate 20, the side wall 36 and the bottom plate 64. The top plate 20 may be arranged directly or indirectly in close contact with an upper end of the side wall 36 in the positive z-direction, so that the coolant flow portion 92 is sealed by the top plate 20, the side wall 36 and the bottom plate 64. The being indirectly in close contact may refer to a state of the upper end of the side wall 36 and the top plate 20 being in close contact via the fixing agent 98 provided between the upper end of the side wall 36 and the top plate 20, which is a sealing material, adhesive material, a brazing material or another member. The being in close contact may refer to a state where the coolant inside the coolant flow portion 92 does not leak through the close contact portion. The upper end of the side wall 36 and the top plate 20 are preferably brazed together. Note that the top plate 20 and the jacket 40 may be formed of metal having the same composition, and the brazing material may be formed of metal having a lower melting temperature than the jacket 40 and the other, for example metal including aluminum.

The fin region 95 of the coolant flow portion 92 may have the cooling pin fins 94 provided of which the quantity is greater along the longer side 96 than along the shorter side 93 of the coolant flow portion 92, and have a substantially rectangular shape longer along the longer side 96 than along the shorter side 93, as shown in FIG. 5 with a dashed line. A quantity of the cooling pin fins 94 provided per unit length may be greater along the longer side 96 than along the shorter side 93 of the coolant flow portion 92. For example, in the fin region 95, a ratio between a quantity of the cooling pin fins 94 provided along the longer side 96 of the coolant flow portion 92 and a quantity of the cooling pin fins 94 provided along the shorter side 93 of the coolant flow portion 92 may be within a predetermined range. The fin region 95 includes a region in which the cooling pin fins 94 are provided and flow paths among the cooling pin fins 94. As seen from the figure, in the fin region 95 in this example, the cooling pin fins 94 are arranged in a staggered manner. Instead, they may be squarely arrayed. A gap between adjacent cooling pin fins 94 may be smaller than the width of the cooling pin fin 94 itself. As shown in FIG. 4, the U-phase unit 70U, the V-phase unit 70V and the W-phase unit 70W in this example are all provided inside the fin region 95. Alternatively, they may be partially provided outside the fin region 95.

The coolant flow portion 92 has a first coolant flow channel 30-1 and a second coolant flow channel 30-2 arranged sandwiching the fin region 95 therebetween in the planar view. The coolant flow channels 30 refer to a space having a predetermined height (a length in the z-direction) or more in the coolant flow portion 92. The predetermined height may be a distance between the top plate 20 and the bottom plate 64.

The first coolant flow channel 30-1 is located at a greater position in the one direction along the shorter side 93 than the fin region 95, is in communication with the inlet 41 and extends along the longer side 96. The second coolant flow channel 30-2 is located at a greater position in the other direction along the shorter side 93 than the fin region 95, is in communication with the outlet 42 and extends along the longer side 96. The direction along which the first and second coolant flow channels 30-1 and 30-2 extend can be translated as the direction along which the longer side 96 of the fin region 95 lies. Note that the first coolant flow channel 30-1 is an example of one communication region and the second coolant flow channel 30-2 is an example of another communication region.

As described above, when heat sources such as the plurality of semiconductor chips 78 exist along the y-direction in the semiconductor apparatus 70 of the semiconductor module 100, if the main flow direction of the coolant used with the cooling apparatus 10 is parallel to the arrangement direction of the heat sources (in the y-direction), the respective heat sources cannot be cooled uniformly. To address this, the arrangement configuration as in the semiconductor module 100 in this embodiment may be taken, of the main flow direction (positive x-direction) of the coolant used with the cooling apparatus 10 being orthogonal to the arrangement direction of the plurality of heat sources (in the y-direction). To be specific, with the semiconductor module 100 in this embodiment, the coolant flow portion 92 has a substantially rectangular shape with the longer sides 96 and the shorter sides 93 when viewed in cross section in a plane (in the x-y plane) parallel to the principal surface of the top plate 20, and the coolant is let in through the inlet 41 in communication with the one section associated with the one direction along the shorter side 93 (in the x-direction) and is let out through the outlet 42 in communication with the other section associated with the other direction along the shorter side 93 (in the x-direction).

The cooling pin fins 94 are arranged in the cooling apparatus 10 to efficiently dissipate heat transferred from the plurality of heat sources, into the coolant flowing inside the coolant flow portion 92. When pin fins having a circular-shaped cross section (in the x-y plane) parallel to the principal surface of the top plate 20 are used with the cooling apparatus 10, the surface area of the pin fins allowed to contact the coolant is small, resulting in lower heat dissipation efficiency compared to when pin fins having a polygonal-shaped cross section (in the x-y plane) parallel to the principal surface of the top plate 20 are used. Further, even when pin fins having a polygonal-shaped cross section (in the x-y plane) parallel to the principal surface of the top plate 20 are used, if the cross section has a shape of square, regular hexagon or the like of which widths in a main flow direction of a coolant in the x-y plane and in the direction orthogonal to the flow direction are equal, or a shape such as a rectangular shape of which a width in the orthogonal direction is longer than the width in the flow direction, an area in a plane orthogonal to the flow direction is larger and flow velocity loss of the coolant increases, resulting in lower heat dissipation efficiency. In contrast, the cooling pin fins 94 arranged in the coolant flow portion 92 has a substantially rhombic shape longer along the shorter side 93 than along the longer side 96 of the coolant flow portion 92 when viewed in cross section in the x-y plane, and therefore the area in the plane orthogonal to the main flow direction of the coolant is smaller for the semiconductor module 100 in this embodiment than for the above-mentioned polygonal pin fins in use, resulting in a smaller flow velocity loss of the coolant.

According to the semiconductor module 100 in this embodiment having the above configuration, in the cooling apparatus 10 attached to the semiconductor apparatus 70, the main flow direction of the coolant flowing inside the coolant flow portion 92 having a substantially rectangular x-y plane cross section is a direction along the shorter side 93 of the substantially rectangular shape, and the x-y plane cross section of the cooling pin fins 94 arranged in the coolant flow portion 92 has a substantially rhombic shape longer in the main flow direction of the coolant. In this manner, with the semiconductor module 100 in this embodiment, the plurality of heat sources of the semiconductor apparatus 70 which generate heat while the semiconductor module 100 is in operation are uniformly cooled, and at the same time, flow velocity loss of the coolant flowing inside the coolant flow portion 92 is reduced, so that the heat dissipation efficiency can be improved.

Further, with the semiconductor module 100 in this embodiment, the inlet 41 and the outlet 42 of the cooling apparatus 10 are located at diagonally opposite ends of the coolant flow portion 92, which has a substantially rectangular shape in the x-y plane. The fin region 95 of the coolant flow portion 92 has cooling pin fins 94 provided of which the quantity is greater along the longer side 96 than along the shorter side 93 of the coolant flow portion 92, and has a substantially rectangular shape longer along the longer side 96 than along the shorter side 93. The coolant flow portion 92 has the first and second coolant flow channels 30-1 and 30-2 arranged to sandwich the fin region 95 therebetween when viewed in the planar view, and the first coolant flow channel 30-1 is located at a greater position in the one direction along the shorter side 93 than the fin region 95, is in communication with the inlet 41 and extends along the longer side 96. The second coolant flow channel 30-2 is located at a greater position in the other direction along the shorter side 93 than the fin region 95, is in communication with the outlet 42 and extends along the longer side 96.

With the semiconductor module 100 in this embodiment having such a configuration, once flowing into the coolant flow portion 92 through the inlet 41, the coolant heads toward the outlet 42 located diagonally opposite to the inlet 41 in the coolant flow portion 92 while spreading within the first coolant flow channel 30-1 so as to head not only along the shorter side 93 of the coolant flow portion 92 which is the main flow direction of the coolant but also along the longer side 96 of the coolant flow portion 92 orthogonal to the main flow direction of the coolant by colliding with the cooling pin fins 94 in the fin region 95, and then is drained through the outlet 42. With the semiconductor module 100 in this embodiment, the plurality of heat sources in the semiconductor apparatus 70 can be even more efficiently and uniformly cooled, which generate heat while the semiconductor module 100 is in operation, for this configuration than for a configuration of an inlet and an outlet for the coolant located at opposite ends of the coolant flow portion 92 along the shorter side 93 of the coolant flow portion 92.

FIG. 6 illustrates one example of a shape of the cross section of the cooling pin fin 94 cut along the x-y plane. On the upper side of the sheet of FIG. 6, shown is a shape of a cross section of the cooling pin fin 94 cut along the x-y plane at a position close to the tip in the positive z-direction, and on the lower side of the sheet, shown is a shape of a cross section of the cooling pin fin 94 cut along the x-y plane at a position close to the base in the positive z-direction.

As described above, the cooling pin fin 94 has a substantially rhombic cross-sectional shape in the x-y plane. In the cross-sectional shape on the tip side of the cooling pin fin 94 shown in FIG. 6, a length of a side of the substantially rhombic shape is indicated as l, a length of the longer one of diagonals extending along the x- and y-directions of the substantially rhombic shape (a diagonal extending along the x-direction) is indicated as d1, and a length of the shorter one (a diagonal extending along the y-direction) is indicated as d2. The substantially rhombic cross-sectional shape of the cooling pin fin 94 has round corners, as described above. As to the cross-sectional shape on the tip side of the cooling pin fin 94 shown in FIG. 6, R-chamfering is performed such that the respective corners of the substantially rhombic x-y plane cross section have the same curvature radius, and each curvature radius is indicated as r.

Similarly, in the cross-sectional shape on the base side of the cooling pin fin 94, a length of a side of the substantially rhombic shape is indicated as L, a length of the longer one of diagonals extending in the x- and y-directions of the substantially rhombic shape (a diagonal extending in the x-direction) is indicated as D1, and a length of the shorter one (a diagonal extending in the y-direction) is indicated as D2. Further similarly, as to the cross-sectional shape on the base side of the cooling pin fin 94 indicated in FIG. 6, R-chamfering is performed such that the respective corners of the substantially rhombic x-y plane cross section have the same curvature radius, and each curvature radius is indicated as R.

As described above, the cooling pin fin 94 extends in such a manner as to taper from the bottom plate 64 toward the top plate 20 in the positive z-direction. Accordingly, as shown in FIG. 6, any of the dimensions of the cross-sectional shape on the tip side (l, d1 or d2) is smaller than the corresponding dimension of the cross-sectional shape on the base side (L, D1, or D2). For example, the lengths l and L of the respective sides of the cross-sectional shapes on the tip side and on the base side of the cooling pin fin 94 in this example may be 1.8 mm and 2.0 mm, respectively.

As one example, the respective corners of the substantially rhombic cross section of the cooling pin fin 94 in this example may be rounded with the curvature radius R ranging from 0.1 mm to 0.2 mm. Further, the curvature radius of the rounded corners of the substantially rhombic x-y plane cross section of the cooling pin fin 94 in this example may be greater at a position close to the top plate 20 than at a position close to the bottom plate 64. As shown in FIG. 6, the curvature radius r of each corner of the substantially rhombic cross section on the tip side may therefore be greater than the curvature radius R of each corner of the substantially rhombic cross section on the base side. Although being typically about, for example, 10 L/min, the flow rate of the coolant flowing inside the coolant flow portion 92 could decrease to about 1 L/min in a case where, for example, a temperature outside the semiconductor module 100 is extremely low, or the external coolant supply source gets out-of-order. Even in such a low flow rate case, more amount of coolant will flow near the top plate 20 by providing the above-mentioned configuration, that is, by making a density of the cooling pin fins 94 sparse in the vicinity of the top plate 20, on which the semiconductor apparatus 70 is mounted, and dense in the vicinity of the bottom plate 64. Further, by making the curvature radius of the corners of the cooling pin fin 94 in the x-y plane greater in the vicinity of the top plate 20 than in the vicinity of the bottom plate 64, flow velocity loss of the coolant flowing inside the coolant flow portion 92 can be smaller in the vicinity of the top plate 20 than in the vicinity of the bottom plate 64. In this manner, despite the decrease of the heat dissipation area of the cooling pin fin 94 in the vicinity of the top plate 20, the flow velocity of the coolant in the vicinity of the top plate 20 is relatively increased, which can enhance the efficiency of dissipating heat generated by each semiconductor chip 78 of the semiconductor apparatus 70.

Figure 7:
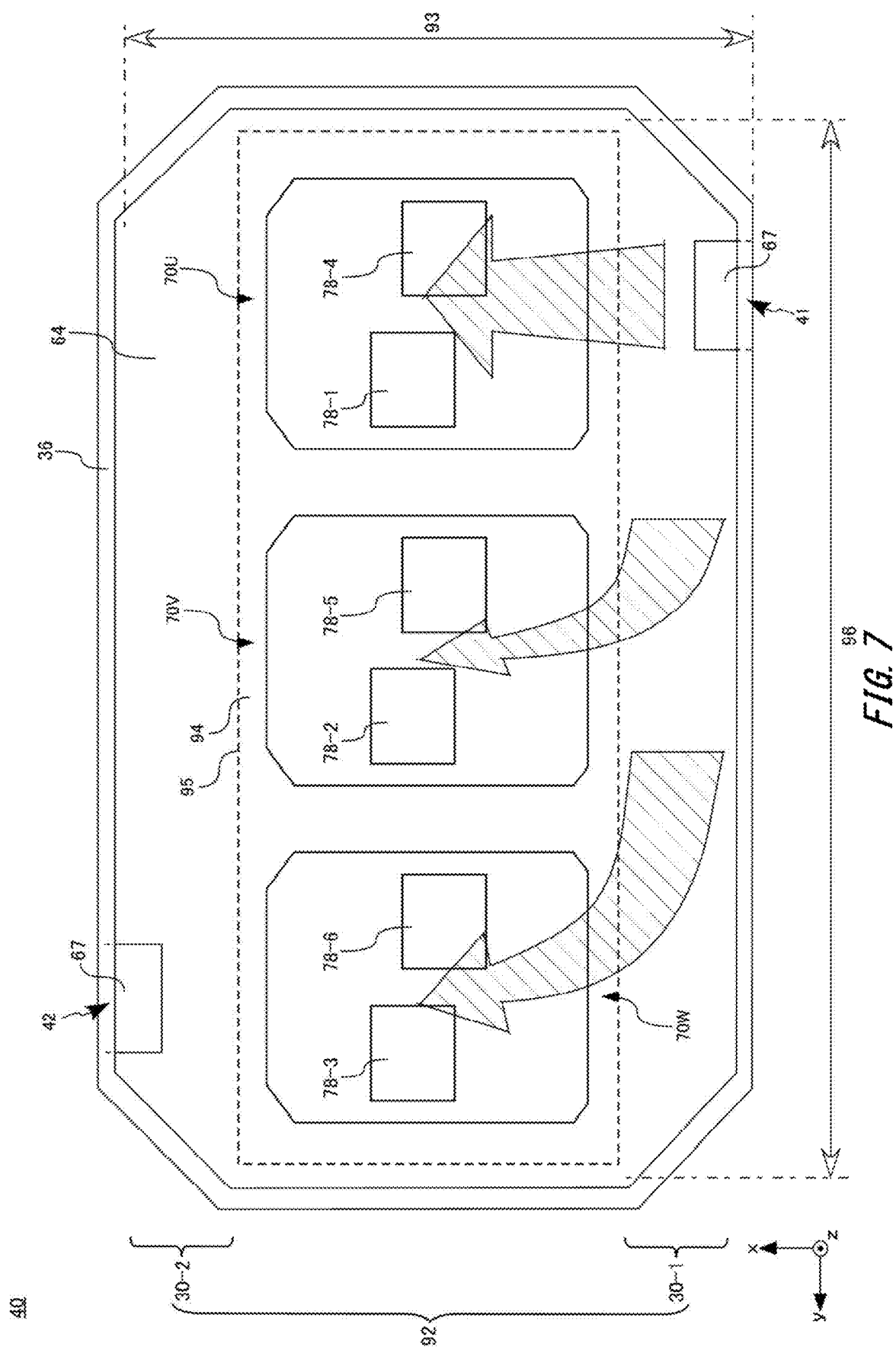
FIG. 7 illustrates one example of difference among flow velocities of the coolant flowing near the respective semiconductor apparatuses 70 in the coolant flow portion 92.

FIG. 7 illustrates one example of difference among flow velocities of the coolant flowing near the respective semiconductor apparatuses 70 in the coolant flow portion 92. In the figure, the main flow directions of the coolant are schematically indicated with arrows filled with oblique lines. Arrow thickness schematically indicates a flow velocity, and a thicker arrow therefore represents a higher flow velocity.

As described above, once flowing into the coolant flow portion 92 through the inlet 41, the coolant heads not only along the positive x-direction, which is the main flow direction of the coolant, but also along the positive y-direction inside the first coolant flow channel 30-1 by colliding the cooling pin fins 94 in the fin region 95, toward the outlet 42 located diagonally opposite to the inlet 41 in the coolant flow portion 92, and thus passes all over the fin region 95. As shown in the figure, the main flow of the coolant let in through the inlet 41 goes into a part of the fin region 95 that is generally associated with the U-phase unit 70U, which is located closest to the inlet 41 of the U-phase unit 70U, the V-phase unit 70V and the W-phase unit 70W, and therefore a flow velocity in that part is relatively high. Also, the coolant is relatively strongly drawn into the outlet 42 in a part of the fin region 95 that is generally associated with the W-phase unit 70W, which is located closest to the outlet 42, and therefore a flow velocity in that part is relatively high. Meanwhile, the V-phase unit 70V is not located close to either of the inlet 41 or the outlet 42, and therefore the flow velocity is relatively low. In particular, in a part of the fin region 95 that is generally associated with the semiconductor chip 78-2, which is located most distant from the inlet 41 of the semiconductor chip 78-5 and the semiconductor chip 78-2 in the V-phase unit 70V, the flow velocity is the lowest.

Figure 8:
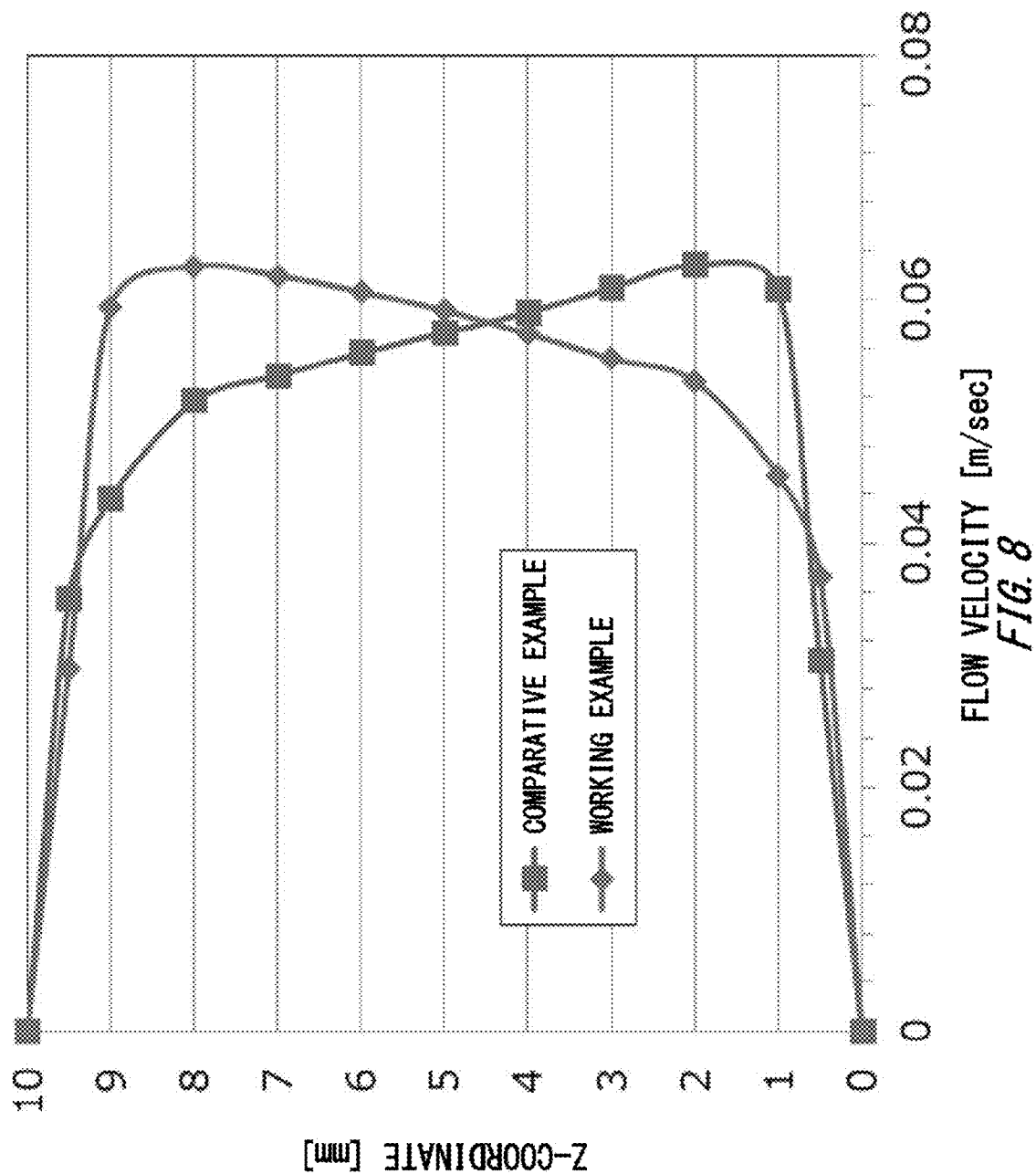
FIG. 8 is a graph showing one example of a distribution of a z-direction flow velocity of the coolant flowing in a part of the fin region 95 that is generally associated with a semiconductor chip 78-2 in a V-phase unit 70V when the coolant flows at a low flow rate.

FIG. 8 is a graph showing one example of a distribution of a z-direction flow velocity of the coolant flowing in a part of the fin region 95 that is generally associated with the semiconductor chip 78-2 in the V-phase unit 70V when the coolant flows at a low flow rate. The horizontal axis of the graph indicates a flow velocity (m/sec) and the vertical axis indicates a z-coordinate (mm). The z-coordinate at the base of the cooling pin fins 94 extending from the bottom plate 64 toward the top plate 20 is 0 mm, and the z-coordinate at the tip of the cooling pin fins 94 in contact with the top plate 20 is 10 mm.

As a working example, the semiconductor module 100 including the cooling pin fins 94 extending in such a manner as to taper from the bottom plate 64 toward the top plate 20 in the positive z-direction as described with reference to FIGS. 1 to 7 is used, and as a comparative example, a semiconductor module including cooling pin fins extending in such a manner as to taper from a top plate toward a bottom plate in a negative z-direction is used. In FIG. 8, the curve plotted using the rhombi indicates the flow velocity distribution for the working example, and the curve plotted using the squares indicates the flow velocity distribution for the comparative example. In this example, regulating the flow rate of the coolant flowing inside the cooling apparatus to 1 L/min for both the working example and the comparative example, the flow velocity distributions for the respective example were measured.

Comparing the z-direction flow velocity distributions of the coolant flowing in the part of the fin region 95 that is generally associated with the semiconductor chip 78-2 for the working example and the comparative example, the distributions are almost reverse of each other, the flow velocity of the coolant is higher in the vicinity of the bottom plate for the comparative example and is higher in the vicinity of the top plate 20 for the working example. The flow velocity at a position 1 mm away from the top plate 20 was approximately 0.06 m/sec for the working example and approximately 0.044 m/sec for the comparative example, and thus a flow velocity for the working example is approximately 1.36 times as high as that for the comparative example Due to such a difference between the flow velocities of the coolant, the thermal resistance Rth (j–w) (° C./W) of the semiconductor chip 78-2 was measured 0.321 (° C./W) for the comparative example and on the other hand, was measured 0.315 (° C./W) for the working example, and thus the thermal resistance for the working example is reduced by 3% compared to the comparative example, which has proven the working example is superior in heat dissipation performance to the comparative example. Note that for this example, comparing the pressure losses of the coolant flow for the working example and for the comparative example, the difference has been proven to be almost negligible.

Figure 9:
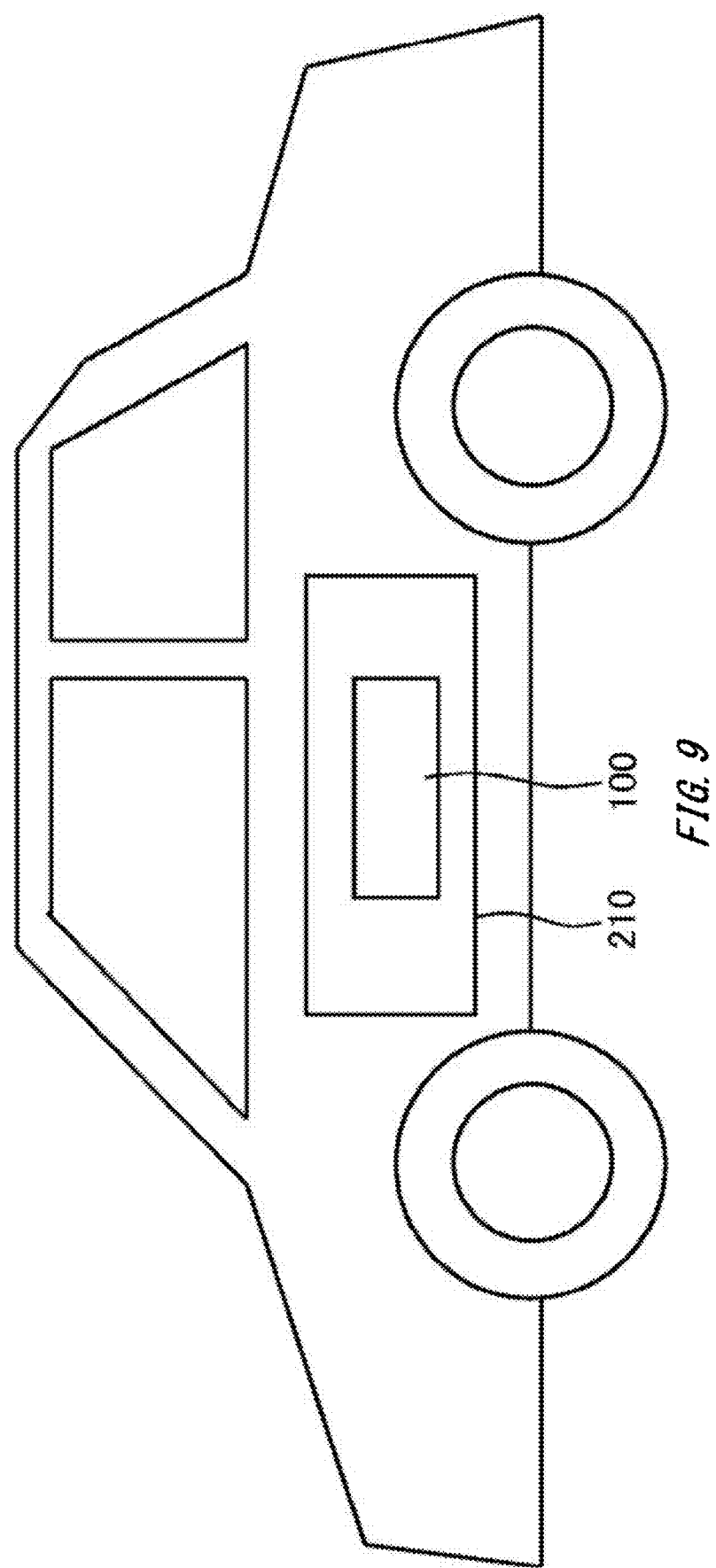
FIG. 9 schematically shows a vehicle 200 according to one embodiment of the present invention.

FIG. 9 schematically shows a vehicle 200 according to one embodiment of the present invention. The vehicle 200 is a vehicle which uses electrical power to generate at least part of thrust. For example, the vehicle 200 is an electric vehicle in which an electrically-driven device such as a motor generates all of thrust, or a hybrid vehicle which uses an electrically-driven device such as a motor in conjunction with an internal combustion engine driven by fuel such as gasoline.

The vehicle 200 includes a control apparatus 210 (an external apparatus) configured to control an electrically-driven device such as a motor. The control apparatus 210 is provided with the semiconductor module 100. The semiconductor module 100 may control electrical power to be supplied to the electrically-driven device.

Figure 10:
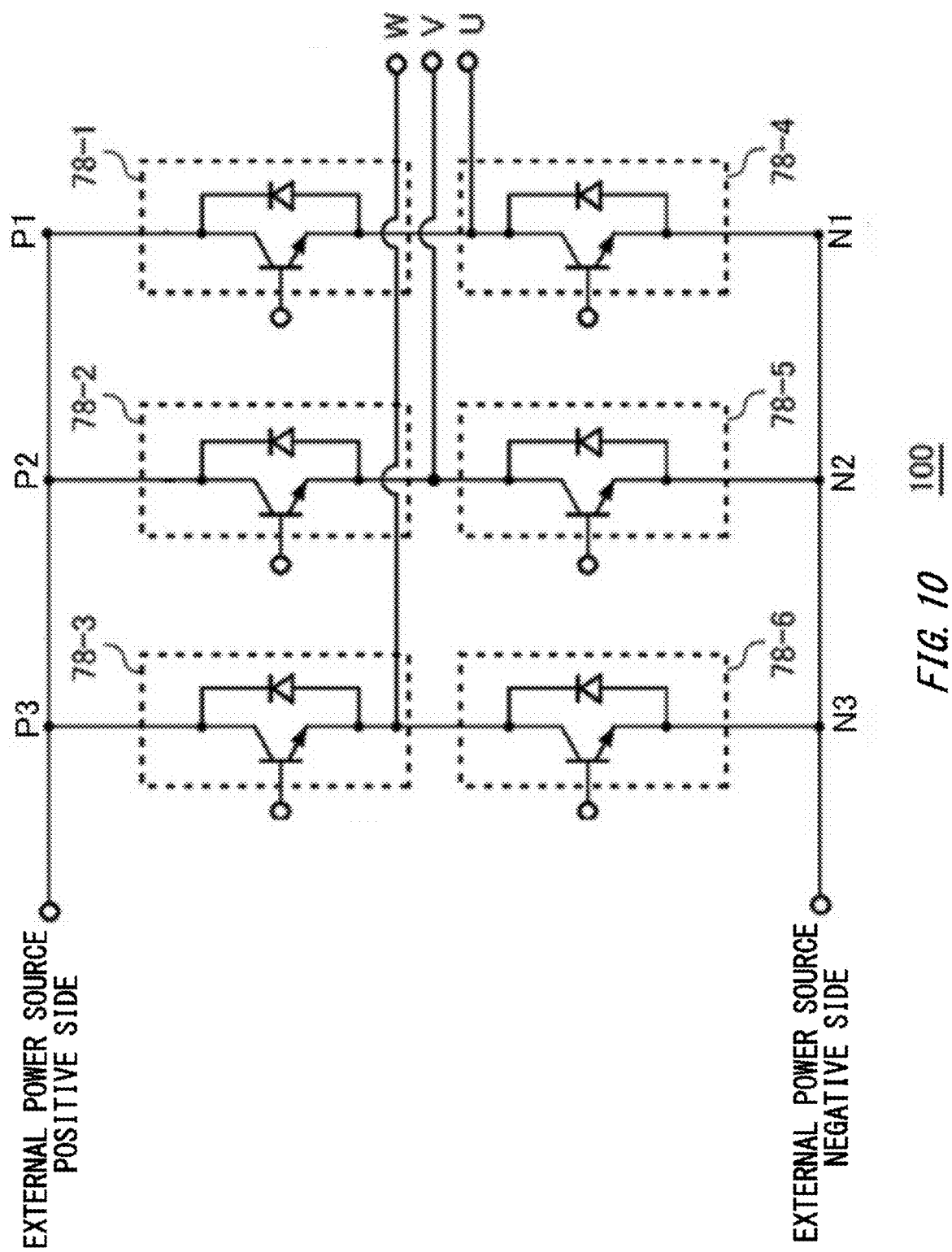
FIG. 10 is a main circuit diagram of the semiconductor module 100 according to one embodiment of the present invention.

FIG. 10 is a main circuit diagram of the semiconductor module 100 according to one embodiment of the present invention. The semiconductor module 100 serves as a three-phase AC inverter circuit including output terminals U, V and W, and may be a part of an in-vehicle unit for driving a motor of a vehicle.

The semiconductor chips 78-1, 78-2 and 78-3 may constitute an upper arm and the semiconductor chips 78-4, 78-5 and 78-6 may constitute a lower arm of the semiconductor module 100. A pair of the semiconductor chips 78-1 and 78-4 may constitute a leg (U-phase). Similarly, a pair of the semiconductor chips 78-2 and 78-5 and a pair of the semiconductor chips 78-3 and 78-6 may constitute legs (V-phase, W-phase). An emitter electrode and a collector electrode of the semiconductor chip 78-4 may be electrically connected to an input terminal N1 and an output terminal U, respectively. An emitter electrode and a collector electrode of the semiconductor chip 78-1 may be electrically connected to the output terminal U and an input terminal P1, respectively. Similarly, an emitter electrode and a collector electrode of the semiconductor chip 78-5 may be electrically connected to an input terminal N2 and an output terminal V, respectively, and an emitter electrode and a collector electrode of the semiconductor chip 78-6 may be electrically connected to an input terminal N3 and an output terminal W, respectively. Further, an emitter electrode and a collector electrode of the semiconductor chip 78-2 may be electrically connected to the output terminal V and an input terminal P2, respectively, and an emitter electrode and a collector electrode of the semiconductor chip 78-3 may be electrically connected to the output terminal W and an input terminal P3, respectively.

Each of the semiconductor chips 78-1 to 78-6 may be alternately switched on and off by a signal input into the corresponding control terminal. Each semiconductor chip 78 in this example may generate heat at the time of switching. The input terminals P1, P2, and P3 may be connected to the positive side of the external power source, the input terminals N1, N2, and N3 to the negative side of the external power source, and the output terminals U, V, and W to a load, respectively. The input terminals P1, P2, and P3 may be electrically connected to one another, and the other input terminals N1, N2, and N3 may also be electrically connected to one another.

The plurality of semiconductor chips 78-1 to 78-6 of the semiconductor modules 100 may each be an RC-IGBT (Reverse Conducting IGBT) semiconductor chip. The semiconductor chips 78-1 to 78-6 may each include a combination of a transistor such as an MOSFET or an IGBT and a diode.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

For example, although in the above-mentioned embodiments, the described configuration is the side wall 36, the bottom plate 64 and the cooling pin fins 94 being integrally formed in the jacket 40, alternatively, the side wall 36 and the integrally formed bottom plate 64 and cooling pin fins 94 may be formed separately and then firmly fixed together with the fixing agent 98 or the like.

For example, although in the above-mentioned embodiments, the described configuration is the cooling pin fins 94 extending along the normal line of the principal surface of the top plate 20, that is, extending perpendicular to the top plate 20 and the bottom plate 64 between the top plate 20 and the bottom plate 64, the cooling pin fins 94 may alternatively extend obliquely at an angle to the normal line of the principal surface of the top plate 20 between the top plate 20 and the bottom plate 64.

For example, although in the above-mentioned embodiments, the described configuration is the inlet 41 for letting the coolant into the coolant flow portion 92 and the outlet 42 for letting the coolant out of the coolant flow portion 92 being formed through the bottom plate 64 and in the vicinity of the boundary with the side wall 36, the inlet 41 and the outlet 42 may alternatively be formed away from the vicinity of the boundary in the x-direction and through the principal surface of the bottom plate 64, or may be formed through the side wall 36. In case of the forming through the side wall 36, the inlet 41 and the outlet 42 may be formed through two side surfaces of the side wall 36 that face each other in the x-direction.

For example, although, in the above-mentioned embodiments, the described configuration is the semiconductor apparatus 70 being directly fixed on the upper surface 22 of the top plate 20 of the cooling apparatus 10, the semiconductor apparatus 70 may alternatively have a base plate exposed on the lower surface of the accommodating portion 72, the circuit board 76 may be fixed on an upper surface of the base plate, and the base plate may be fixed on the upper surface 22 of the top plate 20.

For example, in addition to the above-mentioned embodiments, the cooling apparatus 10 may have a structure serving as setting a position at which the side wall 36 is firmly fixed to the top plate 20. For example, pins may be arranged on and within one of end surfaces of the side wall 36 that is close to the top plate 20 at at least three points, and may be inserted to holes that are provided in the lower surface 24 of the top plate 20 and have a complementary shape to the pins. Alternatively, the top plate 20 may have a stepped portion that protrudes from the lower surface 24 and has a profile slightly smaller than and approximately coincident with the inner circumference of the side wall 36 in the planar view, or a stepped portion that has a profile slightly larger than and approximately coincident with the outer circumference of the side wall 36.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

EXPLANATION OF REFERENCES 10 cooling apparatus, 20 top plate, 22 upper surface, 24 lower surface, 30 coolant flow channel, 30-1 first coolant flow channel, 30-2 second coolant flow channel, 36 side wall, 40 jacket, 41 inlet, 42 outlet, 64 bottom plate, 66 chamfered portion, 67 inclined portion, 70 semiconductor apparatus, 70U U-phase unit, 70V V-phase unit, 70W W-phase unit, 72 accommodating portion, 74 sealing portion, 76 circuit board, 78 semiconductor chip, 92 coolant flow portion, 93 shorter side, 96 longer side, 94, 97 cooling pin fin, 95 fin region, 98 fixing agent, 100 semiconductor module, 200 vehicle, 210 control apparatus

What is claimed is:
1. A semiconductor module comprising a semiconductor apparatus and a cooling apparatus, wherein the semiconductor apparatus includes a semiconductor chip and a circuit board, the semiconductor chip being mounted on the circuit board, and the cooling apparatus includes:
- a top plate, the semiconductor apparatus being mounted on the top plate;
- a jacket including a side wall connected to the top plate, a bottom plate connected to the side wall and facing the top plate, and a cooling pin fin extending in such a manner as to taper from the bottom plate toward the top plate, wherein at least the bottom plate and the cooling pin fin are integrally formed, and at least one of ends of the cooling pin fin is firmly fixed to the top plate;
- a coolant flow portion defined by the top plate and the jacket, and for flow of coolant;
- an inlet in communication with one of sections of the coolant flow portion, the one section being associated with one direction, and for letting coolant into the coolant flow portion; and
- an outlet in communication with another section of the coolant flow portion, the other section being associated with another direction opposite to the one direction, and for letting coolant out of the coolant flow portion, and wherein the cooling pin fin has a substantially rhombic shape long along a direction from the one section toward the other section and having round corners when viewed in cross section in a plane parallel to a principal surface of the top plate, and a curvature radius of the corners in the cross section of the cooling pin fin is greater at a position close to the top plate than at a position close to the bottom plate.

2. The semiconductor module according to claim 1, wherein:

the coolant flow portion has a substantially rectangular shape having longer sides and shorter sides in the plane; and the coolant flow portion has:
- a fin region including the cooling pin fin and having a substantially rectangular shape longer along the longer sides than along the shorter sides;
- one communication region located at a greater position in the one direction than the fin region, being in communication with the inlet and extending along the longer sides; and
- another communication region located at a greater position in the other direction than the fin region, being in communication with the outlet and extending along the longer sides.

3. The semiconductor module according to claim 1, wherein a thickness of the side wall is greater than a thickness of the top plate, and a thickness of the bottom plate is greater than the thickness of the side wall.

4. The semiconductor module according to claim 3, wherein the side wall and the cooling pin fin are the same in dimension.

5. The semiconductor module according to claim 1, wherein:

the cooling pin fin and the top plate are firmly fixed together with a fixing agent; and a distance between cooling pin fins adjacent to each other among a plurality of cooling pin fins is greater than or equal to 5 times a thickness of the fixing agent, wherein the plurality of cooling pin fins includes the cooling pin fin.

6. The semiconductor module according to claim 5, wherein corners of the cooling pin fin that are firmly fixed to the top plate are chamfered, so that the fixing agent has a region in which a fillet has been formed.

7. A vehicle comprising the semiconductor module according to claim 1.

8. A method for manufacturing the semiconductor module according to claim 1, wherein the jacket is formed by punching a single continuous plate member using a mold corresponding to a shape of the jacket.

9. A semiconductor module comprising a semiconductor apparatus and a cooling apparatus, wherein the semiconductor apparatus includes a semiconductor chip and a circuit board, the semiconductor chip being mounted on the circuit board, and the cooling apparatus includes:
- a top plate, the semiconductor apparatus being mounted on the top plate;
- a jacket including a side wall connected to the top plate, a bottom plate connected to the side wall and facing the top plate, and a cooling pin fin extending in such a manner as to taper from the bottom plate toward the top plate, wherein at least the bottom plate and the cooling pin fin are integrally formed, and at least one of ends of the cooling pin fin is firmly fixed to the top plate; and
- a coolant flow portion defined by the top plate and the jacket, and for flow of coolant, and wherein the side wall extends in such a manner as to taper from the bottom plate toward the top plate.

10. The semiconductor module according to claim 9, wherein:

the cooling apparatus further includes:
- an inlet in communication with one of sections of the coolant flow portion, the one section being associated with one direction, and for letting coolant into the coolant flow portion; and
- an outlet in communication with another section of the coolant flow portion, the other section being associated with another direction opposite to the one direction, and for letting coolant out of the coolant flow portion; and the cooling pin fin has a substantially rhombic shape long along a direction from the one section toward the other section and having round corners when viewed in cross section in a plane parallel to a principal surface of the top plate.

11. The semiconductor module according to claim 10, wherein:

the coolant flow portion has a substantially rectangular shape having longer sides and shorter sides in the plane; and the coolant flow portion has:
- a fin region including the cooling pin fin and having a substantially rectangular shape longer along the longer sides than along the shorter sides;
- one communication region located at a greater position in the one direction than the fin region, being in communication with the inlet and extending along the longer sides; and
- another communication region located at a greater position in the other direction than the fin region, being in communication with the outlet and extending along the longer sides.

12. The semiconductor module according to claim 9, wherein
a thickness of the side wall is greater than a thickness of the top plate, and a thickness of the bottom plate is greater than the thickness of the side wall.

13. The semiconductor module according to claim 12, wherein
the side wall and the cooling pin fin are the same in dimension.

14. The semiconductor module according to claim 9, wherein:
the cooling pin fin and the top plate are firmly fixed together with a fixing agent; and
a distance between cooling pin fins adjacent to each other among a plurality of cooling pin fins is greater than or equal to 5 times a thickness of the fixing agent, wherein the plurality of cooling pin fins includes the cooling pin fin.

15. The semiconductor module according to claim 14, wherein
corners of the cooling pin fin that are firmly fixed to the top plate are chamfered, so that the fixing agent has a region in which a fillet has been formed.

16. A vehicle comprising the semiconductor module according to claim 9.

17. A method for manufacturing the semiconductor module according to claim 9, wherein
the jacket is formed by punching a single continuous plate member using a mold corresponding to a shape of the jacket.

* * * * *